(12) United States Patent
Wang et al.

(10) Patent No.: US 10,002,711 B2
(45) Date of Patent: Jun. 19, 2018

(54) LOW TEMPERATURE MULTILAYER DIELECTRIC FILM FOR PASSIVATION AND CAPACITOR

(71) Applicant: Applied Materials, Inc., Santa Clara, CA (US)

(72) Inventors: Dapeng Wang, San Jose, CA (US); Yixuan Wu, Auburn, AL (US); Gaku Furuta, Sunnyvale, CA (US); Tae Kyung Won, San Jose, CA (US); Beom Soo Park, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 114 days.

(21) Appl. No.: 14/970,228

(22) Filed: Dec. 15, 2015

(65) Prior Publication Data

US 2016/0240312 A1    Aug. 18, 2016

Related U.S. Application Data

(60) Provisional application No. 62/116,274, filed on Feb. 13, 2015.

(51) Int. Cl.
| | |
|---|---|
| *H05K 7/00* | (2006.01) |
| *H05K 5/00* | (2006.01) |
| *H01G 4/06* | (2006.01) |
| *H01G 4/30* | (2006.01) |
| *H01G 4/012* | (2006.01) |
| *H05K 1/16* | (2006.01) |

(52) U.S. Cl.
CPC .............. *H01G 4/06* (2013.01); *H01G 4/012* (2013.01); *H01G 4/30* (2013.01); *H05K 1/162* (2013.01); *H05K 2201/0195* (2013.01)

(58) Field of Classification Search
CPC .................................................. H05K 7/20
USPC .................................................. 361/679.27
See application file for complete search history.

(56) References Cited

U.S. PATENT DOCUMENTS

2008/0305572 A1*  12/2008  You ................... H01L 27/14609
                                                        438/59

* cited by examiner

*Primary Examiner* — Jerry Wu
(74) *Attorney, Agent, or Firm* — Patterson + Sheridan LLP

(57) ABSTRACT

The present disclosure generally relates to capacitors having a multilayer dielectric material between two electrodes. The multilayer dielectric material can have a small thickness with little to no breakdown strength reduction. By utilizing a multilayer dielectric structure in a capacitor, not only can the breakdown strength remain at an acceptable level, but the collective thickness of the capacitor may be reduced to accommodate the higher density pixels for display devices or any device that utilizes a capacitor.

14 Claims, 5 Drawing Sheets

LOW TEMPERATURE MULTILAYER DIELECTRIC FILM FOR PASSIVATION AND CAPACITOR

CROSS-REFERENCE TO RELATED APPLICATIONS

This application claims benefit of U.S. Provisional Patent Application Ser. No. 62/116,274 (APPM/22492L), filed Feb. 13, 2015, which is incorporated herein by reference.

BACKGROUND OF THE DISCLOSURE

Field of the Disclosure

Embodiments of the present disclosure generally relate to a multilayer dielectric disposed between two electrodes.

Description of the Related Art

A typical capacitor comprises two electrodes spaced apart by a dielectric layer. Capacitors are used in many industries such as solar, flat panel display, semiconductor, as well as many others. In the display industry, capacitors are used inside the pixel that will be illuminated. The display industry is regularly increasing the density of pixels used in a display device. A higher density of pixels leads to smaller pixels, which necessarily leads to smaller capacitors. In order to achieve a desired capacitance within a smaller area, higher k values or thinner films are used.

Silicon nitride is a well-known dielectric material used for capacitors. Improving the k value of silicon nitride is very difficult. Other high k materials can be used instead of silicon nitride, but materials other than silicon nitride are slow to deposit and hard to etch. Reduced silicon nitride thickness leads to lower breakdown strength, which is undesired.

Therefore, there is a need in the art for an improved capacitor.

SUMMARY OF THE DISCLOSURE

The present disclosure generally relates to capacitors having a multilayer dielectric material between two electrodes. The multilayer dielectric material can have a small thickness with little to no breakdown strength reduction.

In one embodiment, a capacitor includes a first electrically conductive layer; a multilayer dielectric structure disposed on the first electrically conductive layer; and a second electrically conductive layer disposed on the multilayer dielectric structure.

In another embodiment, a capacitor includes a first electrically conductive layer; a first dielectric layer disposed on the first electrically conductive layer; a second dielectric layer disposed on the first dielectric layer; and a second electrically conductive layer disposed on the second dielectric layer.

In another embodiment, a display system is disclosed. The display system may include a substrate, a plurality of pixels, a front screen, and a capacitor. The capacitor may include a first electrically conductive layer, a first dielectric layer composed of silicon nitride, a second dielectric layer with a different composition than the first dielectric layer, and a second electrically conductive layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present disclosure generally relates to capacitors having a multilayer dielectric material between two electrodes. The multilayer dielectric material can have a small thickness with little to no breakdown strength reduction.

The disclosure is illustratively described below utilized in a processing system, such as a plasma enhanced chemical vapor deposition (PECVD) system available from AKT America, a division of Applied Materials, Inc., located in Santa Clara, Calif. However, it should be understood that the disclosure has utility in other system configurations, including those sold by other manufacturers.

Figure 1:
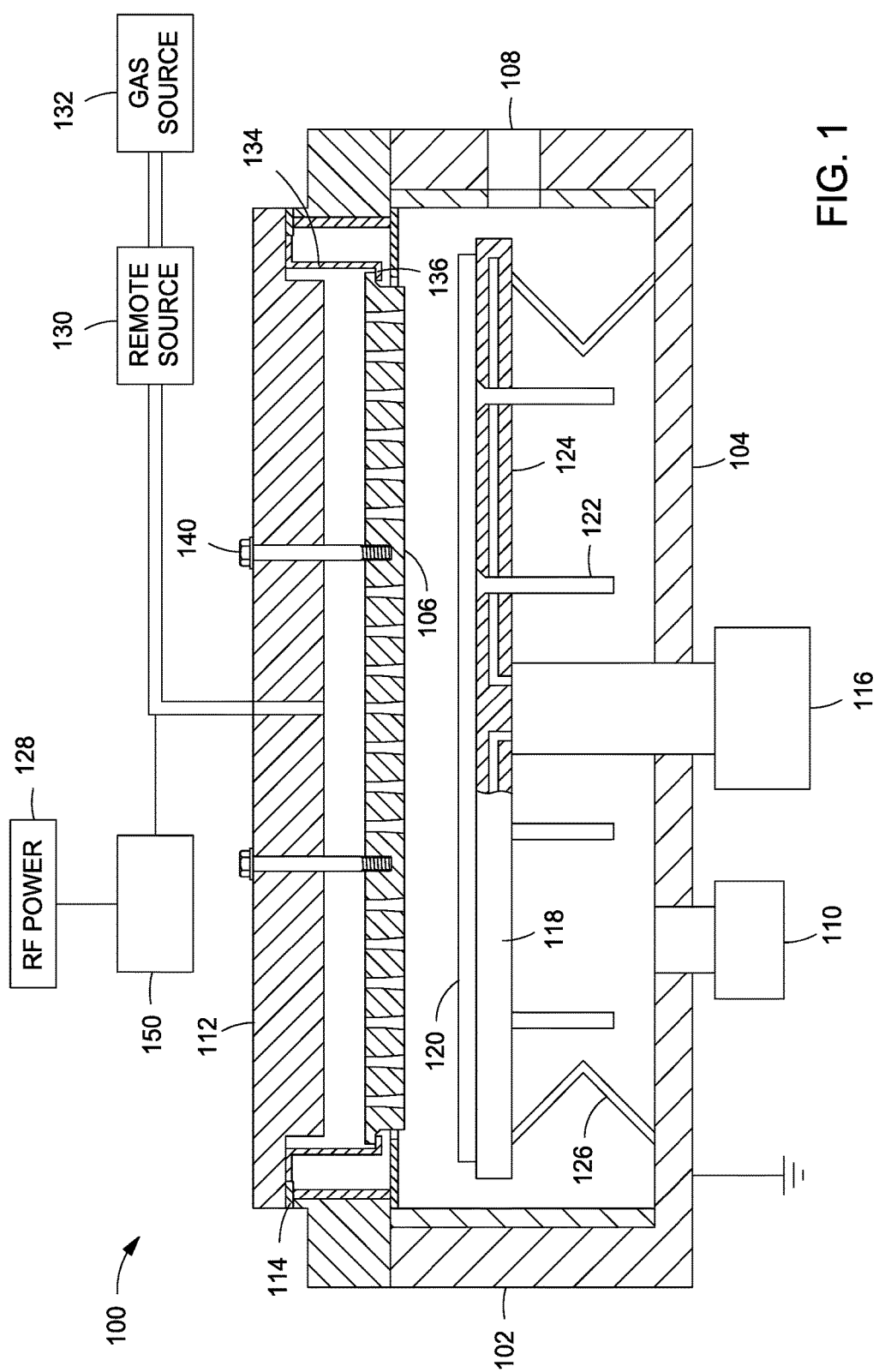
FIG. 1 a cross-sectional view of a process chamber according to one embodiment.

FIG. 1 is a schematic, cross sectional view of a process chamber that may be used to perform the operations described herein. The apparatus includes a chamber 100 in which one or more films may be deposited onto a substrate 120. The chamber 100 generally includes walls 102, a bottom 104 and a showerhead 106 which define a process volume. A substrate support 118 is disposed within the process volume. The process volume is accessed through a slit valve opening 108 such that the substrate 120 may be transferred in and out of the chamber 100. The substrate support 118 may be coupled to an actuator 116 to raise and lower the substrate support 118. Lift pins 122 are moveably disposed through the substrate support 118 to move a substrate to and from the substrate receiving surface. The substrate support 118 may also include heating and/or cooling elements 124 to maintain the substrate support 118 at a desired temperature. The substrate support 118 can also include RF return straps 126 to provide an RF return path at the periphery of the substrate support 118.

The showerhead 106 can be coupled to a backing plate 112 by a fastening mechanism 140. The showerhead 106 may be coupled to the backing plate 112 by one or more fastening mechanisms 140 to help prevent sag and/or control the straightness/curvature of the showerhead 106.

A gas source 132 can be coupled to the backing plate 112 to provide process gases through gas passages in the showerhead 106 to a processing area between the showerhead 106 and the substrate 120. The gas source 132 can include a silicon-containing gas supply source, an oxygen containing gas supply source, and a carbon-containing gas supply source, among others. Typical process gases useable with one or more embodiments include silane ($SiH_4$), disilane, $N_2O$, ammonia ($NH_3$), $H_2$, $N_2$ or combinations thereof.

A vacuum pump 110 is coupled to the chamber 100 to control the process volume at a desired pressure. An RF source 128 can be coupled through a match network 150 to the backing plate 112 and/or to the showerhead 106 to provide an RF current to the showerhead 106. The RF current creates an electric field between the showerhead 106 and the substrate support 118 so that a plasma may be generated from the gases between the showerhead 106 and the substrate support 118.

A remote plasma source 130, such as an inductively coupled remote plasma source 130, may also be coupled between the gas source 132 and the backing plate 112. Between processing substrates, a cleaning gas may be provided to the remote plasma source 130 so that a remote plasma is generated. The radicals from the remote plasma may be provided to chamber 100 to clean chamber 100 components. The cleaning gas may be further excited by the RF source 128 provided to the showerhead 106.

The showerhead 106 may additionally be coupled to the backing plate 112 by showerhead suspension 134. In one embodiment, the showerhead suspension 134 is a flexible metal skirt. The showerhead suspension 134 may have a lip 136 upon which the showerhead 106 may rest. The backing plate 112 may rest on an upper surface of a ledge 114 coupled with the chamber walls 102 to seal the chamber 100.

Figure 2A:
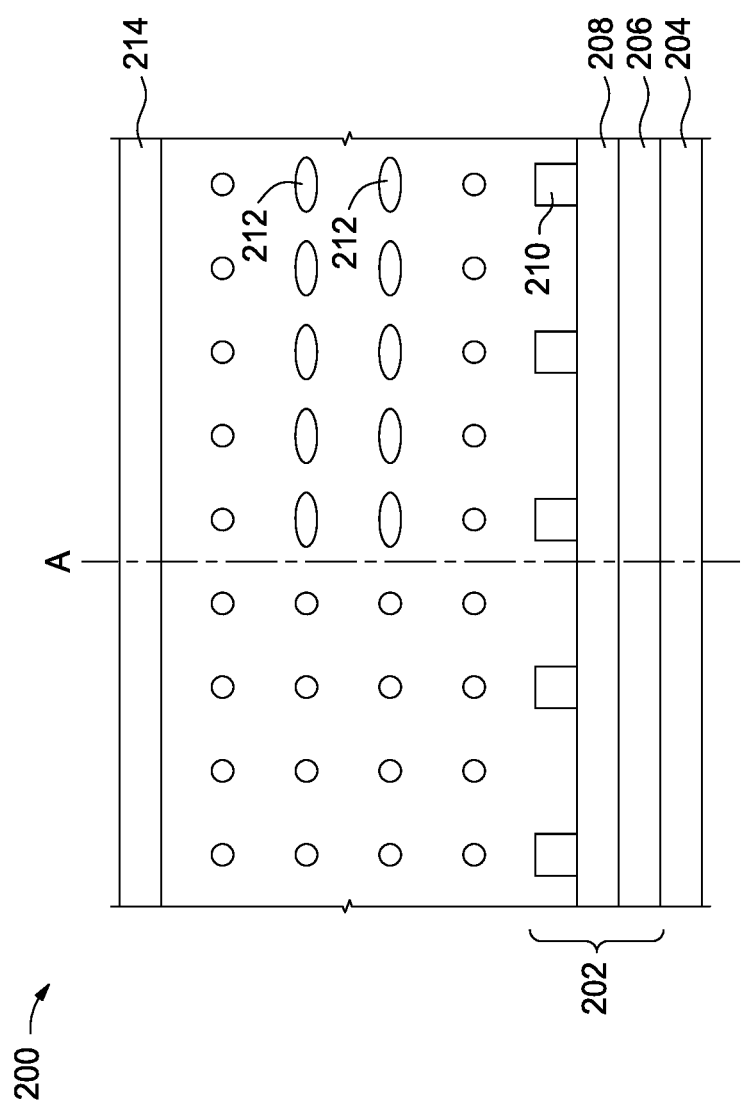
FIG. 2A is a schematic illustration of an LCD having a capacitor.
Figure 3:
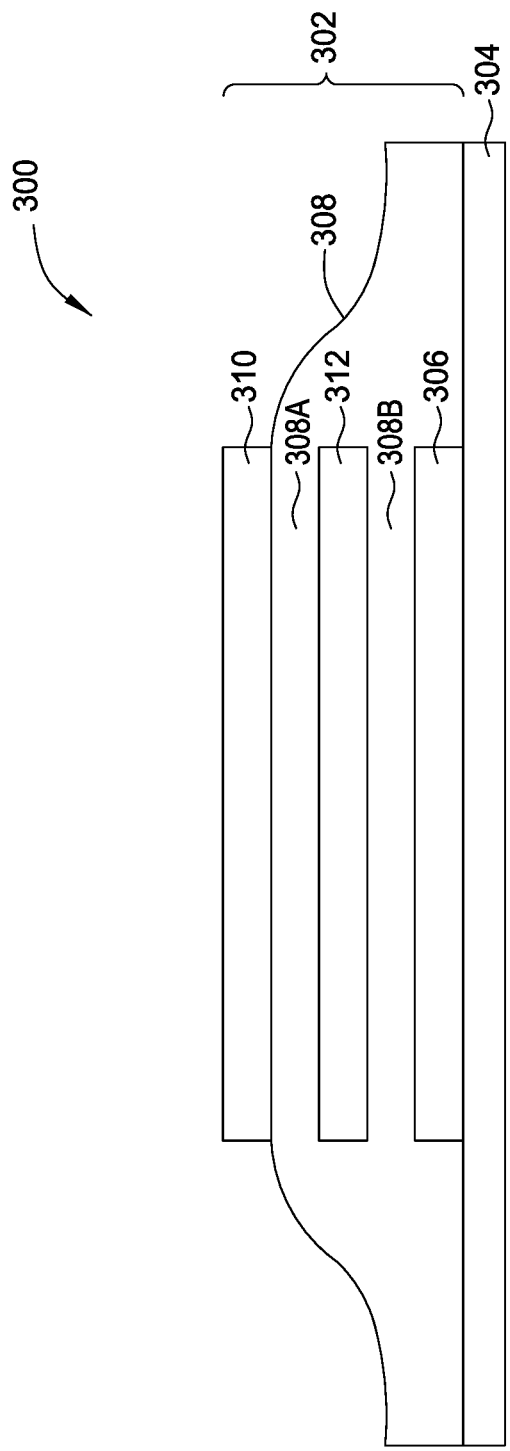
FIG. 3 is a schematic illustration of a cross section of an organic light-emitting diode (OLED) having a capacitor.

FIG. 2A is a schematic illustration of a liquid crystal display (LCD) 200 having a capacitor 202. The LCD 200 includes a substrate 204. The substrate 204 may be silicon, germanium, a semiconductor material, glass, plastic, or other well-known material. It is to be understood that the capacitors described herein are not limited to use with LCDs. The capacitors described herein may be used for OLED applications as seen in FIG. 3 below, Quantum Dot applications, TV's, computer screens, smart phones, smart watches, wearable electronics, and any general electronic device that utilizes a capacitor.

The capacitor 202 includes a first electrode 206, dielectric structure 208 and a second electrode 210. The second electrode 210 is a pixel electrode. A plurality of liquid crystals 212 is present between the second electrode 210 and the front screen 214. As shown in FIG. 2A, liquid crystals 212 to the left of the dashed line "A" are off while liquid crystals 212 to the right of the dashed line "A" are on.

Figure 2B:
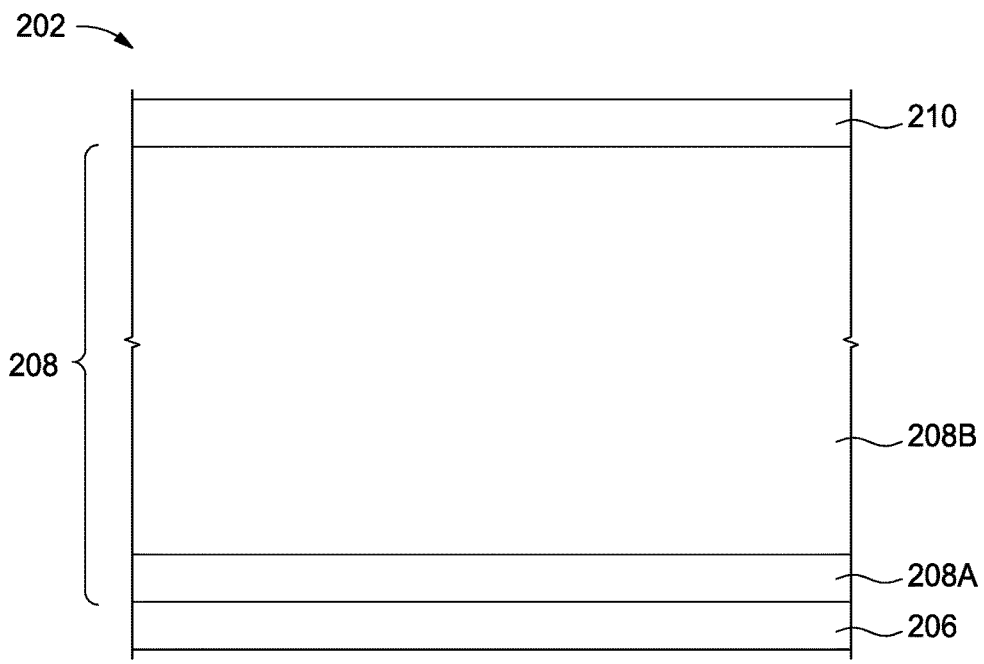
FIG. 2B is a schematic illustration of a capacitor according to one embodiment.

FIG. 2B is a schematic illustration of a capacitor 202 according to one embodiment. The capacitor 202 includes a dielectric structure 208 that includes multiple layers including at least a first dielectric layer 208A and a second dielectric layer 208B. In one embodiment, a first dielectric layer 208A can be silicon oxide. In another embodiment, a first dielectric layer 208A can be silicon nitride. In another embodiment, a first dielectric layer 208A can be silicon oxynitride. The different layers of the multilayer dielectric layer may be different materials, or if the same material, different stoichiometric ratios. The first and second dielectric layers 208A, 208B may be different materials or, if the same material, different stoichiometric ratios. It is to be understood that while only two layers are shown, more layers are contemplated for the dielectric structure 208.

Figure 2C:
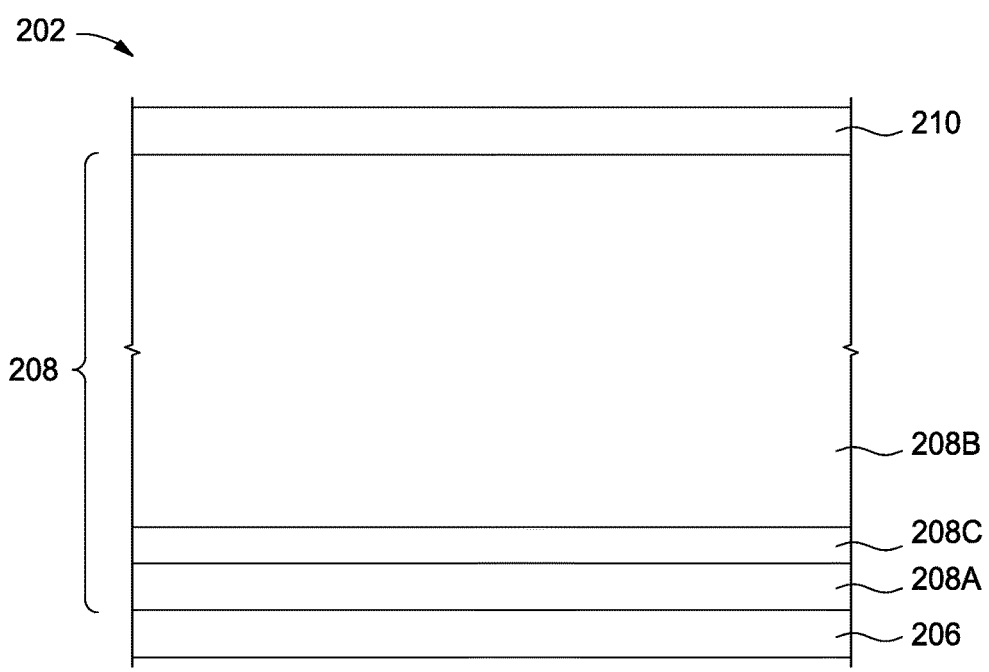
FIG. 2C is a schematic illustration of a capacitor according to another embodiment.

FIG. 2C is a schematic illustration of a capacitor 202 according to another embodiment. It can be understood that the multilayer dielectric structure may be a combination of more than two layers, for example, two silicon oxide layers with a layer of silicon nitride in between. As way of example, the dielectric structure 208 could include a layer of silicon nitride 208C, a layer of silicon oxide 208B, and a layer of silicon oxynitride 2A, and a layer of aluminum oxide.

In another embodiment, the dielectric structure 208 can include a silicon nitride layer, a silicon oxide layer, a silicon oxynitride layer, and an aluminum oxide layer. It should be understood that the multi-dielectric structure 208 including, in one embodiment 208A, 208B, and 208C, is between a first electrically conductive layer 206 and a second electrically conductive layer 210. In addition to the embodiments described above, it can be imagined that the dielectric structure can include more layers, a combination of different materials, or if the same material a combination of different stoichiometric ratios.

At least one layer of the dielectric structure 208 may be silicon nitride. An additional layer of the dielectric structure 208 may be silicon nitride having a different stoichiometric ratio as compared to the at least one layer of the multilayer dielectric structure. In one embodiment, at least one layer of the dielectric structure 208 is selected from the group consisting of silicon nitride, silicon oxide, silicon oxynitride, aluminum oxide, and combinations thereof. The first dielectric layer 208A has a thickness of between about 1 percent to about 50 percent of a total thickness of the multilayer dielectric structure. The dielectric structure 208 has a thickness of between about 50 Angstroms and about 3000 Angstroms. The capacitor 202 has a breakdown field of between about 6 MV/cm to about 9 MV/cm. In one embodiment, the first layer 208A may be silicon oxide and the second layer 208B may be silicon nitride. In another embodiment, the first layer 208A may be silicon oxynitride and the second layer 208B may be silicon nitride. In another embodiment, the first layer 208A may be silicon nitride and the second layer 208B may be silicon oxide.

Figure 2D:
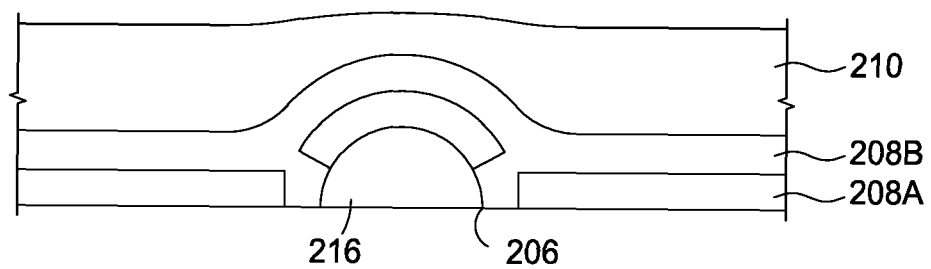
FIG. 2D is a schematic illustration of a capacitor having a multilayer dielectric structure where an undesired particle is present on the first electrode.

FIG. 2D is a schematic illustration of a capacitor 202 having a multilayer dielectric structure 208 where an undesired particle 216 is present on the first electrode 206. As shown in FIG. 2C, the first layer 208A does not perfectly cover the particle 216, but the second layer 208B does to ensure that there is no direct contact between the first electrode 206 and the second electrode 210. Then layers of the dielectric structure 208 may be deposited by well known deposition methods such as PECVD, CVD, PVD and ALD. In one embodiment, the first dielectric layer 208A is disposed adjacent the anode of the capacitor.

FIG. 3 is a schematic illustration of a cross section of an organic light-emitting diode (OLED) structure 300 having a capacitor 302. The capacitor 302 may be the capacitor 202 described above. The capacitor 302 may have a double capacitance with an increased capacitance above 600 pixels per inch (ppi). The OLED structure 300 may include a substrate 304. The substrate 304 supports the capacitor 302 and may be a composite of silica. The capacitor 302 may include a first electrode 306, dielectric structure 308, a gate 312, and a second electrode 310. The gate 312 may include a single organic material layer or multiple layers. The first electrode 306 may be indium tin oxide. The second electrode 310 may be aluminum.

The capacitor 302 includes a dielectric structure 308 that includes multiple layers including at least a first dielectric layer 308A and a second dielectric layer 308B. In one embodiment, a first dielectric layer 308A can be silicon oxide. In another embodiment, a first dielectric layer 308A can be silicon nitride. In another embodiment, a first dielectric layer 308A can be silicon oxynitride. The different layers of the multilayer dielectric layer may be different materials, or if the same material, different stoichiometric ratios. The first and second dielectric layers 308A, 308B may be different materials or, if the same material, different stoichiometric ratios. It is to be understood that while only two layers are shown, more layers are contemplated for the dielectric structure 308.

At least one layer of the dielectric structure 308 may be silicon nitride. An additional layer of the dielectric structure 308 may be silicon nitride having a different stoichiometric ratio as compared to the at least one layer of the multilayer dielectric structure. In one embodiment, at least one layer of the dielectric structure 308 is selected from the group consisting of silicon nitride, silicon oxide, silicon oxynitride, aluminum oxide, and combinations thereof.

By utilizing a multilayer dielectric structure in a capacitor, not only can the breakdown strength remain at an acceptable level, but the collective thickness of the capacitor may be reduced to accommodate the higher density pixels for display devices. It is to be understood that the capacitors disclosed herein are not to be limited to display devices. Rather, the capacitors disclosed herein are to be understood to be usable in any device that utilizes a capacitor.

While the foregoing is directed to embodiments of the present disclosure, other and further embodiments of the disclosure may be devised without departing from the basic scope thereof, and the scope thereof is determined by the claims that follow.

The invention claimed is:

1. A capacitor, comprising: a first electrically conductive layer; a multilayer dielectric structure disposed on the first electrically conductive layer, wherein a first layer of the multilayer dielectric structure comprises silicon nitride, wherein a second layer of the multilayer dielectric structure comprises silicon oxide, and wherein a third layer of the multilayer dielectric structure comprises aluminum oxide; and the multilayer dielectric structure disposed between a second electrically conductive layer and the first electrically conductive layer.

2. The capacitor of claim 1, wherein at least one additional layer of the multilayer dielectric structure comprises silicon nitride having a different stoichiometric ratio as compared to the at least one layer of the multilayer dielectric structure.

3. The capacitor of claim 1, wherein at least one layer of the multilayer dielectric structure is selected from the group consisting of silicon oxynitride, and combinations thereof.

4. The capacitor of claim 3, wherein the at least one layer of the multilayer dielectric structure has a thickness of between about 1 percent to about 50 percent of a total thickness of the multilayer dielectric structure.

5. The capacitor of claim 4, wherein another layer of the multilayer dielectric structure comprises silicon oxynitride.

6. The capacitor of claim 1, wherein the multilayer dielectric structure has a thickness of between about 50 Angstroms and about 3000 Angstroms.

7. The capacitor of claim 1, wherein the capacitor has a breakdown field of between about 6 MV/cm to about 9 MV/cm.

8. A capacitor, comprising: a first electrically conductive layer; a first dielectric layer disposed on the first electrically conductive layer, wherein the first dielectric layer comprises silicon oxynitride; a second dielectric layer disposed on the first dielectric layer, wherein the second dielectric layer comprises aluminum oxide; a third dielectric layer disposed on the second dielectric layer, wherein the third dielectric layer comprises silicon nitride; and wherein the first, second, and third dielectric layers are disposed between the first electrically conductive layer and a second electrically conductive layer disposed on the second dielectric layer.

9. The capacitor of claim 8, wherein the first dielectric layer is selected from the group consisting of silicon oxide, silicon oxynitride, aluminum oxide, and combinations thereof.

10. The capacitor of claim 9, wherein the first dielectric layer has a thickness of between about 1 percent to about 50 percent of a total thickness of the multilayer dielectric structure.

11. The capacitor of claim 10, wherein the first dielectric layer and the second dielectric layer have a collective thickness of between about 50 Angstroms and about 3000 Angstroms,
wherein the capacitor has a breakdown field of between about 6 MV/cm to about 9 MV/cm.

12. A display system comprising, a substrate; a plurality of pixels; a front screen; and a capacitor, wherein the capacitor comprises: a first electrically conductive layer; a first dielectric layer composed of silicon nitride; a second dielectric layer with a different composition than the first dielectric layer; and a third dielectric layer; the third dielectric layer composed of aluminum oxide; and the first, second, and third dielectric layers are disposed between the first electrically conductive layer and a second electrically conductive layer.

13. The display system of claim 12, wherein the second dielectric layer is composed of silicon nitride having a different stoichiometric composition than the first dielectric layer.

14. The display system of claim 12, wherein the plurality of pixels are disposed between the second electrically conductive layer and the front screen.

* * * * *